United States Patent
Ramirez et al.

(10) Patent No.: US 10,345,864 B1
(45) Date of Patent: Jul. 9, 2019

(54) MULTI-STANDARD CHASSIS SECURITY SLOT FOR INFORMATION HANDLING SYSTEMS

(71) Applicant: Dell Products, LP, Round Rock, TX (US)

(72) Inventors: Ernesto Ramirez, Austin, TX (US); Michael David, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 15/994,782

(22) Filed: May 31, 2018

(51) Int. Cl.
*H05K 7/14* (2006.01)
*G06F 1/16* (2006.01)

(52) U.S. Cl.
CPC .......... *G06F 1/1679* (2013.01); *G06F 1/1656* (2013.01); *H05K 7/1401* (2013.01)

(58) Field of Classification Search
CPC ............ E05B 73/0005; E05B 73/0082; E05B 2047/0016; E05B 2047/002; E05B 2073/0088; E05B 47/0012; Y10T 70/5009; Y10T 70/40; G06F 1/1679; G06F 1/1656; G06F 21/86; H05K 7/1401
USPC ............ 70/14, 57, 58, 18, 266; 361/679.27, 361/679.4, 679.57, 726
See application file for complete search history.

(56) References Cited

U.S. PATENT DOCUMENTS

| | | | |
|---|---|---|---|
| 4,421,217 A | 12/1983 | Vagias | |
| 5,381,685 A | 1/1995 | Carl | |
| 5,502,989 A | 4/1996 | Murray, Jr. | |
| 6,006,557 A | 12/1999 | Carl | |
| 6,199,413 B1 | 3/2001 | McDaid | |
| 6,295,847 B1 | 10/2001 | Zeren | |
| 8,230,707 B2 | 7/2012 | Hung | |
| 2006/0107073 A1 | 5/2006 | Lane | |
| 2009/0145184 A1 | 6/2009 | Cheaz | |
| 2009/0184822 A1* | 7/2009 | Mahaffey | E05B 73/0005 340/568.1 |
| 2009/0193528 A1* | 7/2009 | Ruch | E05B 73/0082 726/35 |
| 2010/0269552 A1* | 10/2010 | Morrison | E05B 73/0005 70/58 |
| 2010/0320884 A1* | 12/2010 | Shiroishi | E05B 73/0082 312/223.1 |
| 2014/0079481 A1* | 3/2014 | Tseng | E05B 73/0082 403/376 |

* cited by examiner

*Primary Examiner* — Abhishek M Rathod
(74) *Attorney, Agent, or Firm* — Prol Intellectual Property Law, PLLC; H. Kenneth Prol

(57) ABSTRACT

An information handling system comprising a chassis containing a processor and a memory and having a mounting aperture to receive a first cable lock slot interface of a reconfigurable security slot interface insert operatively coupled internally to the chassis, and the reconfigurable security slot interface insert having the first cable lock slot interface and a second cable lock slot interface, wherein the first cable lock slot interface is compatible with a first cable lock type and the second cable lock slot interface is compatible with a second cable lock type.

20 Claims, 8 Drawing Sheets

US 10,345,864 B1

MULTI-STANDARD CHASSIS SECURITY SLOT FOR INFORMATION HANDLING SYSTEMS

FIELD OF THE DISCLOSURE

The present disclosure generally relates to a method and apparatus for securing an information handling system via a cable lock system and, in particular, a reconfigurable security slot insert for such a method and apparatus.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, and networking systems. Information handling systems can also implement various virtualized architectures. Data communications among information handling systems may be via networks that are wired, wireless, optical or some combination. The monetary value of information handling systems, especially mobile information handling systems, makes it desirable to provide physical security to prevent theft of the information handling system or potentially access to data thereon.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

DETAILED DESCRIPTION OF THE DRAWINGS

Figure 1:
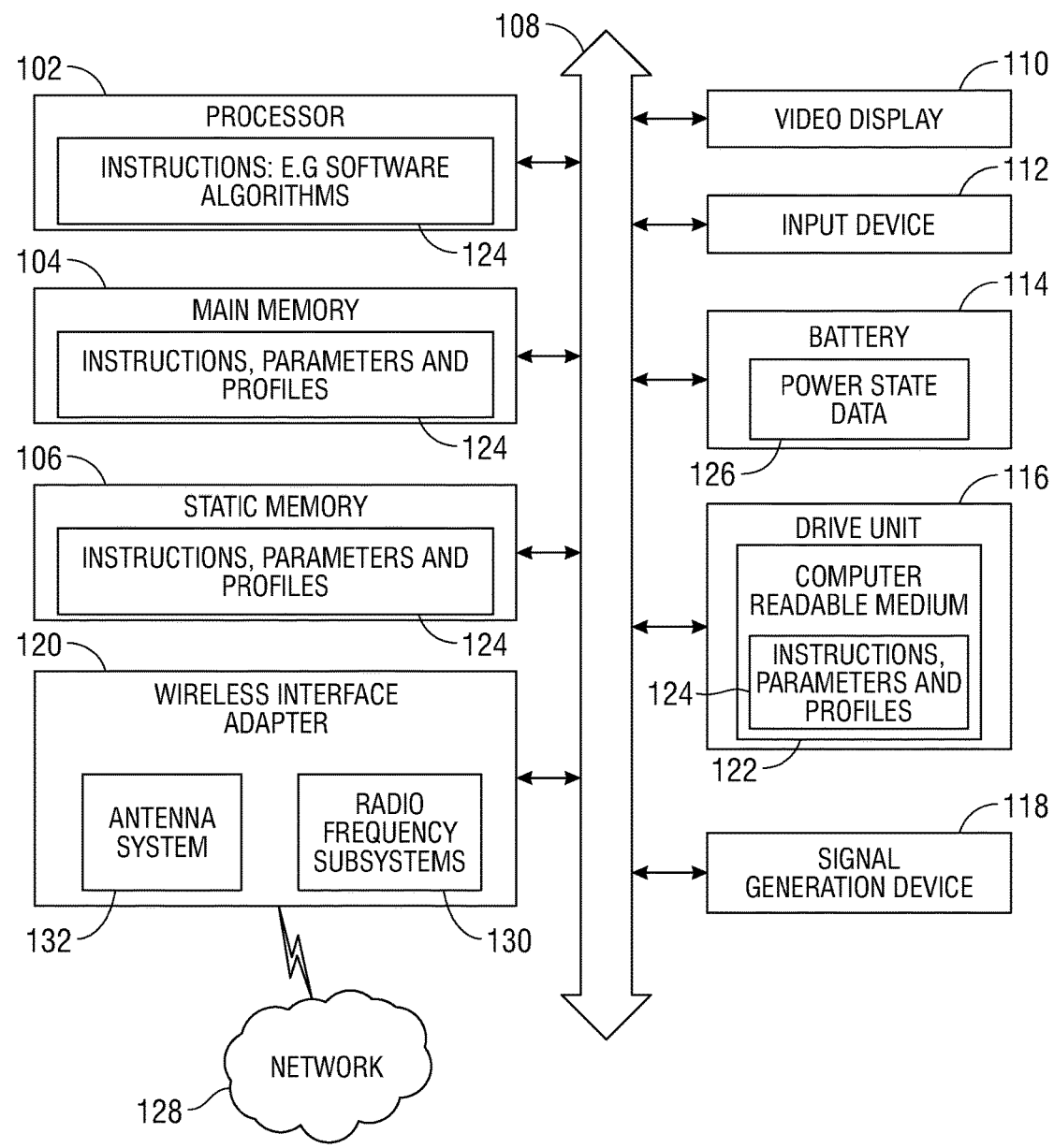
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality. The information handling system can include memory (volatile (e.g. random-access memory, etc.), non-volatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

The cost of information handling system, and in particular mobile information handling systems, as well as the value of data contained on those system makes information handling systems potential targets of theft. In some cases, quick grab theft may be a problem for owners or users of information handling systems in public or semi-public places, within enterprises, at government installations, or in other environments. To deter such theft, a variety of cable locking systems may be used to securely anchor information handling system to prevent or limit the ability of a thief to grab an information handling system without being observed or without tools to remove the information handling system. To anchor the information handling systems with these cable locking systems, an insertable portion of the cable locking system may be secured to a compatible slot internal to the information handling system via an interface aperture in the information handling system chassis.

Several varieties of cable lock systems are available on the market. Often the varieties of cable lock system provided by manufacturers have distinct slot dimension requirements and designs for anchoring the cable locking system to the chassis of an information handling system. For example, Noble® Wedge cable locking systems and Kensington® NanoSaver cable lock systems are two popular and widely utilized cable lock systems having differing specifications and function. Users, for example IT managers in large enterprises, may have deployed a multitude of cable locking system types. Similarly, manufacturers selling information handling systems may not be certain which type of locking system may be desired for purchasers of their systems. Independent cable lock slot interfaces for multiple types of cable lock systems would drive up costs for an additional bracket and impact position and location of I/O ports, power buttons, power connections, venting, or other features in already crowded information handling system chassis designs. Further, two or more cable lock slot inserts may be provided, but the additional cost and shipping of an alternative inserts and the risk of loss of parts creates additional complexity and cost. Thus, additional complexity, consumption of precious space, or added cost makes some solutions less workable.

According to various embodiments of the present disclosure, a reconfigurable insert having two or more types of cable lock slot interfaces may be used. For example, a reversible insert having both a cable lock slot interface accommodating a Noble® Wedge lock system and another cable lock slot interface accommodating a Kensington® NanoSaver lock system may be utilized. In some embodiments, the reconfigurable security slot interface insert may be a single piece. In other embodiments, the reconfigurable security slot interface insert may include a plurality of pieces fittingly coupled. Having each cable lock slot interface on each side of the reconfigurable security slot interface insert that may tow-in into a single chassis opening may provide for re-orientation of the insert to provide for a choice of cable lock slot interface type. The user may order the correct lock slot interface type when ordering an information handling system to be manufactured with limited additional cost in some aspects.

Further, the reconfigurable security slot interface insert provides for flexibility to change the cable lock slot interface type to align with different cable lock systems in an office environment in other aspects. The reconfigurable security slot interface insert of various embodiments described herein may be attached or mounted internally in an information handling system. For example, in some embodiments, the reconfigurable security slot interface insert may be attached via two attachment screws which, upon access to the inside of the information handling system chassis, may be removed. Further to such an embodiment, the reconfigurable security slot interface insert may be rotated with the alternate cable lock slot interface toed into the chassis mounting aperture. In such a way, an efficient reconfigurable security slot interface insert may provide for an option to easily switch between two or more types of cable locking systems to secure an information handling system according to aspects of the embodiments described herein.

FIG. 1 shows an information handling system 100 capable of administering each of the specific embodiments of the present disclosure. The information handling system 100 can represent an information handling system which may be secured via systems and embodiments shown in FIGS. 2A-5B. Information handling system 100 may represent a mobile information handling system such as a laptop computer system, a wireless communication device, a tablet computing system, or the like. An information handling system may execute instructions via a processor for a plurality of application programs and operating systems as understood. Information handling system 100 may also represent a networked server or other system. The information handling system 100 may include a processor 102 such as a central processing unit (CPU), a graphics processing unit (GPU), or both. Moreover, the information handling system 100 can include a main memory 104 and a static memory 106 that can communicate with each other via a bus 108.

As shown, the information handling system 100 may further include a video display unit 110, such as a liquid crystal display (LCD), an organic light emitting diode (OLED), a flat panel display, a solid state display, or a cathode ray tube (CRT). Display 110 may include a touch screen display module and touch screen controller (not shown) for receiving user inputs to the information handling system 100. In the case of several flat panel display systems including LCD or OLED displays, it is desirable to minimize an edge border and maximize the size of the display on the surface of the information handling system. In some cases, information handling systems may have a chassis containing various components and access may be made via one or more accessible panels to the interior of the information handling system chassis. For example, access may be made via a plurality of screws for a panel or side of the chassis. In some example embodiments a plurality of screws, such as six or eight screws, may be used to remove a bottom panel on an information handling system chassis to obtain access to the inside of the chassis. In other embodiments, a top panel surface, side chassis surfaces, back surface, or front surfaces of a chassis may be accessed via removal of screws or other fasteners. Other chassis panels may utilize snap fit panels requiring certain tools to access.

Additionally, the information handling system 100 may include an input device 112, such as a keyboard, and a cursor control device, such as a mouse or touchpad or similar peripheral input device. The information handling system may include a power source such as battery 114 or an A/C power source. The information handling system 100 can also include a disk drive unit 116, and a signal generation device 118, such as a speaker or remote control. The information handling system 100 can include a network interface device such as a wireless adapter 120. The information handling system 100 can also represent a server device whose resources can be shared by multiple client devices, or it can represent an individual client device, such as a desktop personal computer, a laptop computer, a tablet computer, a mobile smartphone, or a wearable computing device.

The information handling system 100 can include a set of instructions 124 that can be executed to cause the computer system to perform any one or more of the methods or computer based functions. Various software modules comprising application instructions 124 may be coordinated by an operating system (OS) and via an application programming interface (API). An example operating system may include Windows®, Android®, and other OS types known in the art. Example APIs may include Win 32, Core Java API, or Android APIs. In a further example, processor 102 may conduct processing of sets of instructions in software, firmware, hardware or any combination of the same to achieve functions understood to be performed by the information handling system 100 according to disclosures herein. The computer system 100 may operate as a standalone device or may be connected such as using a network, to other computer systems or peripheral devices.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a PDA, a mobile information handling system, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or subsystems that individually or jointly execute a set, or multiple sets, of instructions to perform one or more computer functions.

The disk drive unit 116 may include a computer-readable medium 122 in which one or more sets of instructions 124 such as software can be embedded. Similarly, main memory 104 and static memory 106 may also contain computer-readable medium for storage of one or more sets of instructions, parameters, or profiles 124. The disk drive unit 116 and static memory 106 also contains space for data storage. Further, the instructions 124 may embody one or more of the methods or logic as described herein. For example, instructions relating to the various software algorithms and data may be stored here. In particular, the instructions, parameters, and profiles 124 may reside completely, or at least partially, within the main memory 104, the static memory 106, and/or within the disk drive 116 during execution by the processor 102 of information handling system 100. As explained, some or all of the software, firmware or hardware instructions may be executed locally or remotely. The main memory 104 and the processor 102 also may include computer-readable media. Battery 114 may include a smart battery system that tracks and provides power state data 126. This power state data may be stored with the instructions, parameters, and profiles 124.

The network interface device shown as wireless adapter 120 can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. Wireless adapter 120 may include one or more radio frequency subsystems 130 with transmitter/receiver circuitry, wireless controller circuitry, amplifiers and other circuitry for wireless communications. Each radiofrequency subsystem 130 may communicate with one or more wireless technology protocols. The wireless adapter 120 may also include antenna system 132 which may be tunable antenna systems in some embodiments.

The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. Wireless adapter 120 may connect to any combination of macro-cellular wireless connections including 2G, 2.5G, 3G, 4G, 5G or the like from one or more service providers. The wireless adapter 120 can represent an add-in card, wireless network interface module that is integrated with a main board of the information handling system or integrated with another wireless network interface capability, or any combination thereof. In an embodiment the wireless adapter 120 may include one or more radio frequency subsystems 130 including transmitters and wireless controllers for connecting via a multitude of wireless links. The radio frequency subsystems 130 include wireless controllers to manage authentication, connectivity, communications, power levels for transmission, buffering, error correction, baseband processing, and other functions of the wireless adapter 120. The wireless adapter 120 may also connect to the external network via a WPAN, WLAN, WWAN or similar wireless switched Ethernet connection. The wireless data communication standards set forth protocols for communications and routing via access points, as well as protocols for a variety of other operations.

In some embodiments, dedicated hardware implementations such as application specific integrated circuits, programmable logic arrays and other hardware devices can be constructed to implement one or more of the applications operating on the information handling system 100. Applications that may include the apparatus and systems of various embodiments can broadly include a variety of electronic and computer systems. One or more embodiments may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the applications executed by the information handling system may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions, parameters, and profiles 124 or receives and executes instructions, parameters, and profiles 124 responsive to a propagated signal; so that a device connected to a network 128 can communicate voice, video or data over the network 128. Further, the instructions 124 may be transmitted or received over the network 128 via the network interface device or wireless adapter 120.

Information handling system 100 includes one or more application programs 124, and Basic Input/Output System and firmware (BIOS/FW) code 124. BIOS/FW code 124 functions to initialize information handling system 100 on power up, to launch an operating system, and to manage input and output interactions between the operating system and the other elements of information handling system 100. In a particular embodiment, BIOS/FW code 124 reside in memory 104, and include machine-executable code that is executed by processor 102 to perform various functions of information handling system 100. In another embodiment (not illustrated), application programs and BIOS/FW code reside in another storage medium of information handling system 100. For example, application programs and BIOS/FW code can reside in drive 116, in a ROM (not illustrated) associated with information handling system 100, in an option-ROM (not illustrated) associated with various devices of information handling system 100, in storage system 107, in a storage system (not illustrated) associated with network channel of a wireless adapter 120, in another storage medium of information handling system 100, or a combination thereof. Application programs 124 and BIOS/FW code 124 can each be implemented as single programs, or as separate programs carrying out the various features as described herein.

Several of the components of a mobile information handling system will reside within a case or chassis and may be mounted to a chassis as described in embodiments herein. This may include a reconfigurable security slot interface insert for use in anchoring one or more varieties security cable lock systems. The reconfigurable security slot interface insert of several embodiments herein may be re-oriented as described to switch types of cable lock slot interfaces and the various components described may need to be accessed within the chassis from time to time. Security for information handling systems without additional use of cable security apertures in the chassis enable thinner and more efficient designs. Thus, the reconfigurable security slot interface insert in the chassis and case of the information handling system provides for simpler reconfiguration of cable lock slot interfaces for used with a plurality of cable lock systems with limited additional costs.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Figure 2A:
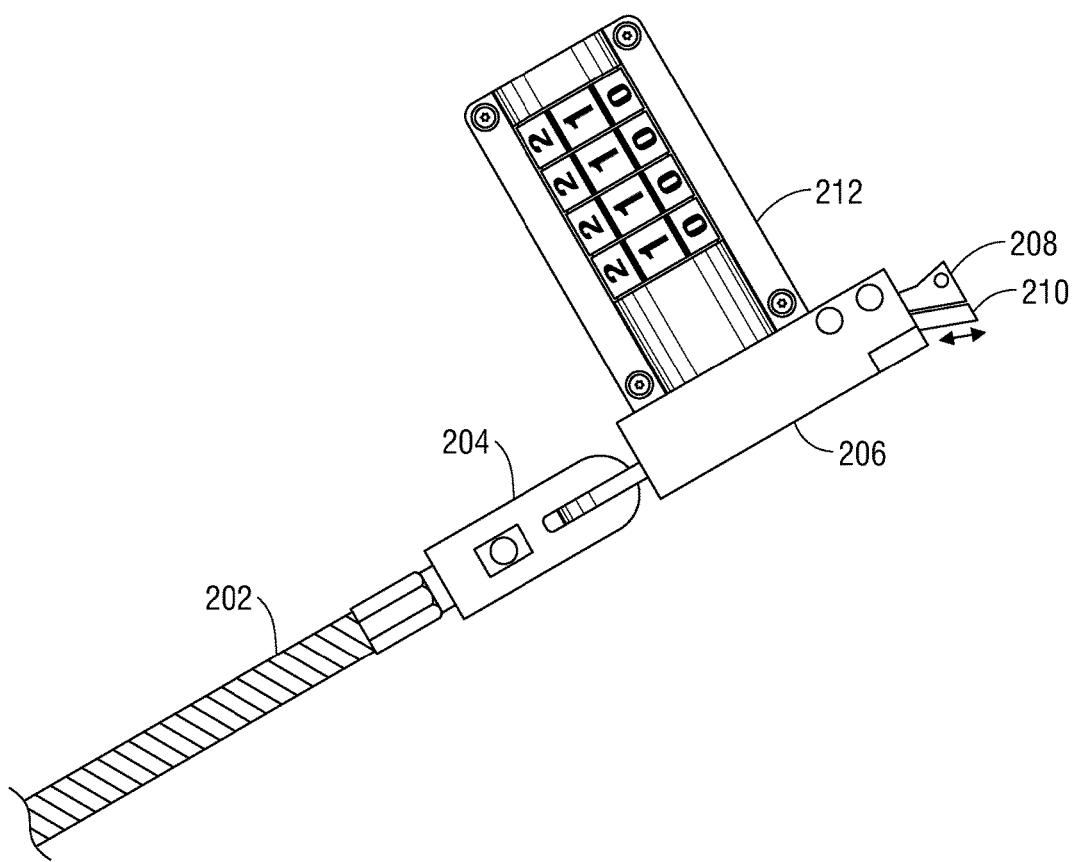
FIG. 2A is a graphic diagram of a first cable lock type with an insertable wedge for use with information handling systems.

FIG. 2A illustrates a Noble® wedge cable lock for use with information handling systems. The Noble® wedge lock includes a cable 202 and a hinged cable attachment end 204. The hinged cable attachment 204 is operatively connected to a main body 206 of the Noble® wedge lock. A locking mechanism as understood in the art may be disposed inside the main body of the lock 206 is actuated by a dial-operated combination mechanism 212. Actuation of the dial-operated combination mechanism 212 actuates the lock mechanism in the body 206 to slidingly extend or retract movable wedge portion 210 alongside wedge 208. In a retracted position of movable wedge portion 210, wedge 208 fits into a Noble® wedge lock slot interface operatively coupled to the chassis of an information handling system. To lock the cable lock of FIG. 2A to a Noble® wedge lock slot interface, the movable wedge portion 210 is slidingly extended inside the Noble® wedge lock slot interface such that both the wedge 208 and movable wedge portion 210 engage with wedged or angled sides of the Noble® wedge interface. In an extended position, wedge 208 and movable wedge 210 are wider than the aperture of the Noble® wedge lock slot interface opening and the cable lock may secure the information handling system. Changing the combination on the dial-operated combination mechanism 212 prevents the movable wedge 210 from being retracted without the correct combination entered.

Figure 2B:
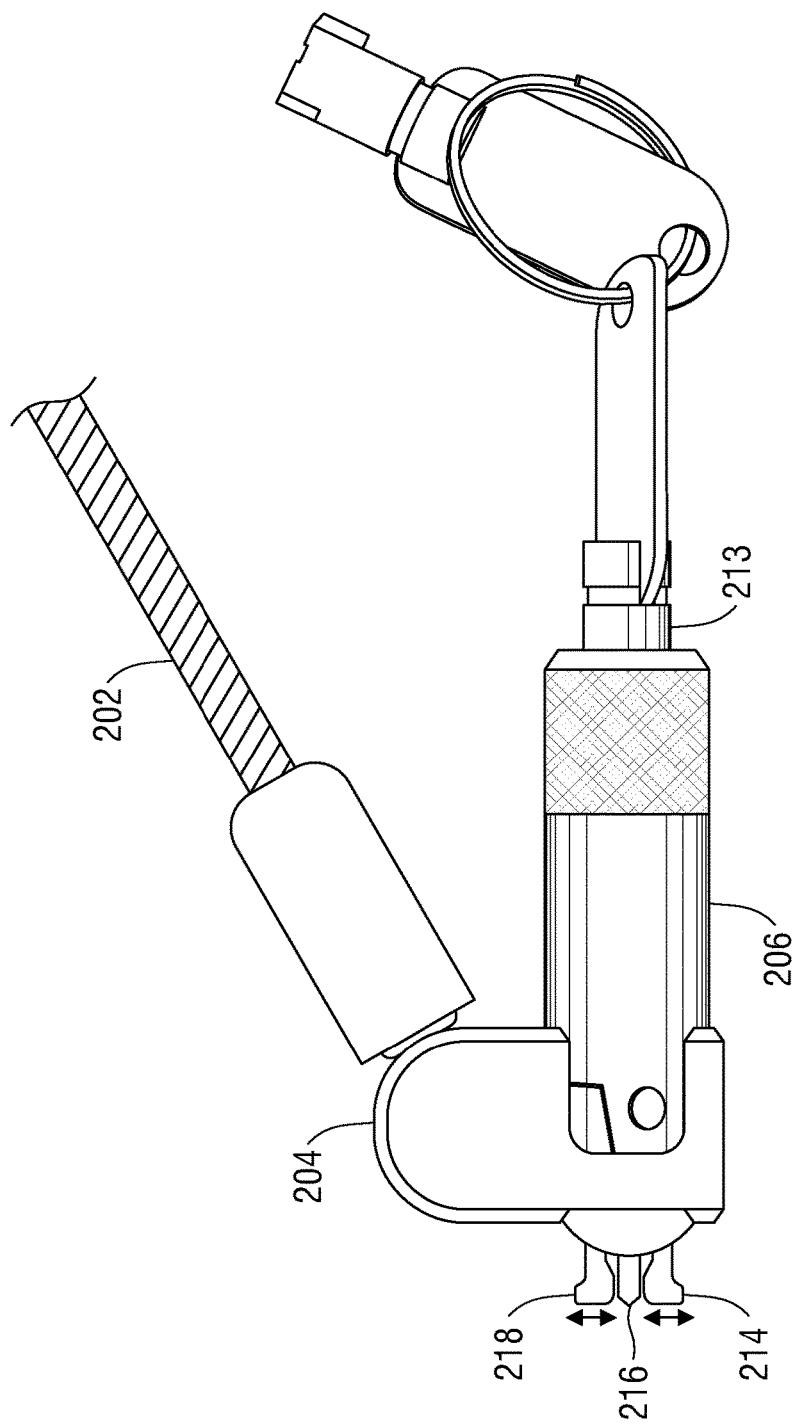
FIG. 2B is a graphic diagram of a second cable lock with an insertable wedge for use with information handling systems.

FIG. 2B illustrates a Kensington® Nano-Saver cable lock for use with information handling systems. The Kensington® Nano-Saver lock includes a cable 202 and a hinged cable attachment end 204. The hinged cable attachment 204 is operatively connected to a main body 206 of the Kensington® Nano-Saver lock. As understood in the art, a locking mechanism inside the main body of the lock 206 is actuated by a key 213. Actuation of the key 213 in a keyway (not shown) actuates a lock mechanism in the body 206 to expand the width of an insertable wedge of the cable lock in some embodiments. In an embodiment, the insertable wedge includes a center wedge extender 216 that may slidingly extend or retract between side elbow portions 214 and 218. In a retracted position of movable center wedge extender 216, side elbow portions 214 and 218 fit into a Kensington® Nano-Saver interface operatively coupled to the chassis of an information handling system. To lock the cable lock of FIG. 2B to a Kensington® Nano-Saver interface, the movable center wedge extender 216 is slidingly extended inside the Kensington® Nano-Saver interface such that both the side elbow portions 214 and 218 engage with sides of the Kensington® Nano-Saver interface in an embodiment. The side elbow portions 214 and 218 include hooked or curved ends to extend in opposite directions to form an insertable wedge that extends beyond the sides of the Kensington® Nano-Saver lock slot interface in such embodiments. In an extended position, center wedge extender 216 and side elbow portions 214 and 218, including the hooked ends of side elbow portions 214 and 218, extend into a wider space behind the aperture of the Kensington® Nano-Saver interface opening in embodiments herein. The hooked ends of side elbow portions 214 and 218 engage the back of the Kensington® Nano-Saver lock slot interface to anchor the cable lock and secure the information handling system in such an aspect. Removal of the key 213 prevents the movable center wedge extender 216 from being retracted without the key.

In other embodiments (not shown), a t-bar cable lock may be used whereby a t-bar is insertable in a cable lock slot interface in a first orientation. The insertable t-bar may be rotatable with actuation of a key or combination dial and a locking mechanism into a second orientation in an embodiment. For example, in some embodiments, the insertable t-bar may be rotated 90 degrees when inside a wider space behind the aperture of the t-bar cable lock slot interface opening. In such an embodiment, curved sides of the insertable t-bar engage the interface in a second orientation with respect to the opening, for example, if the second orientation of the cable lock slot interface opening is narrower than the first orientation. It is anticipated that other variations of cable locking mechanisms and insertable anchors may also be used with the embodiments herein and may include various current or future insertable anchor types.

Figure 3A:
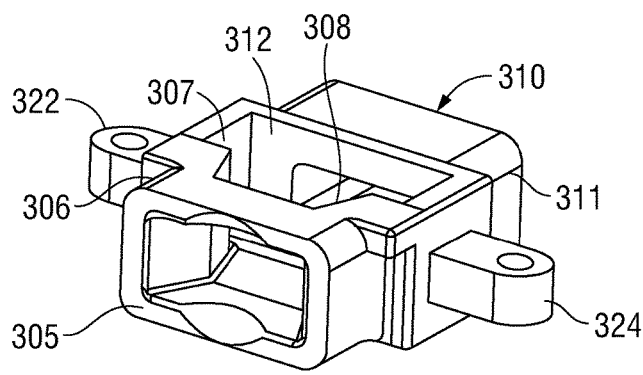
FIG. 3A is a graphic diagram perspective view of a first cable lock slot interface on a reconfigurable security slot interface insert according to an embodiment of the present disclosure.

FIG. 3A illustrates a perspective view of a reconfigurable security slot interface insert according to an embodiment of the present disclosure. The reconfigurable security slot interface insert is a two-sided, reversible insert that has plural interfaces able to accommodate a plurality of cable lock slot types. In an example embodiment, the reconfigurable security slot interface insert has plural cable lock interfaces providing security slots that may accommodate a Noble® wedge cable lock type and Kensington® Nano-Saver cable lock types. For example, the first cable lock slot interface 305 is able to accommodate a Noble® wedge cable lock wedge system as described above for FIG. 2A. A first interface collar extension 306 provides the aperture for the first cable lock slot interface 305. The first interface collar extension 306 may be positioned to fit within an aperture mounting on a side of an information handling system chassis while the reconfigurable security slot interface insert is operatively coupled and secured to the interior of the chassis.

Behind the aperture of the first cable lock slot interface 305 and in the interior of the reconfigurable security slot interface insert are two angled walls 307 and 308. When the movable wedge, such as 210 above, is retracted with respect to the main wedge 208, the insertable wedge of a Noble® wedge cable lock may fit through the aperture of the first cable lock slot interface 305 into the interior of the reconfigurable security slot interface insert. As the movable wedge, such as 210, of the Noble® wedge lock is extended next to the main wedge, such as 208, the main wedge and movable wedge fill the space between angled walls 307 and 308 behind the aperture to the aperture of the first cable lock slot interface 305 in the interior of the reconfigurable security slot interface insert in an example embodiment. Angled retention walls 307 and 308 are at the interior end of the aperture of the first cable lock slot interface 305. The main wedge and the extended movable wedge will engage the angled walls 307 and 308 to anchor and secure the insertable wedge of the Noble® wedge cable lock in the reconfigurable security slot interface insert.

The reconfigurable security slot interface insert also includes one or more attachment mechanisms in various embodiments. In an example embodiment, coupling tabs 322 and 324 with screw holes for attachment to the base of an information handling system chassis may be used. The reconfigurable security slot interface insert also has a second side with a second cable lock slot interface 310 able to accommodate a second cable lock system type for attachment and securing a cable lock system of a different type. An aperture of the second cable lock slot interface 310 is provided in a second interface collar extension 311 that may also be inserted in a mounting aperture in an information handling system chassis in some embodiments. In one example embodiment, the second interface collar extension 311 may be of the same perimeter dimension as the first interface collar extension 306 so that it will fit in the same mounting aperture in the information handling system allowing a user to switch between types of cable lock systems deployed for the information handling system. A retention wall 312 in the interior of the reconfigurable security slot interface insert is interior to the aperture of the second cable lock slot interface 310. Retention wall 312 works with the second type of cable lock system such as one with an insertable wedge or a t-bar insert in some embodiments. Retention wall 312 may be used to securely retain a insertable wedge of the second type of cable lock system in the reconfigurable security slot interface insert when the second cable lock slot interface 310 is used as described in embodiments herein. In some other embodiments, retention wall 312 may be used to securely retain a insertable and rotatable t-bar of another second type of cable lock system in the reconfigurable security slot interface insert when the second cable lock slot interface 310 is used as described in some embodiments herein.

Figure 3B:
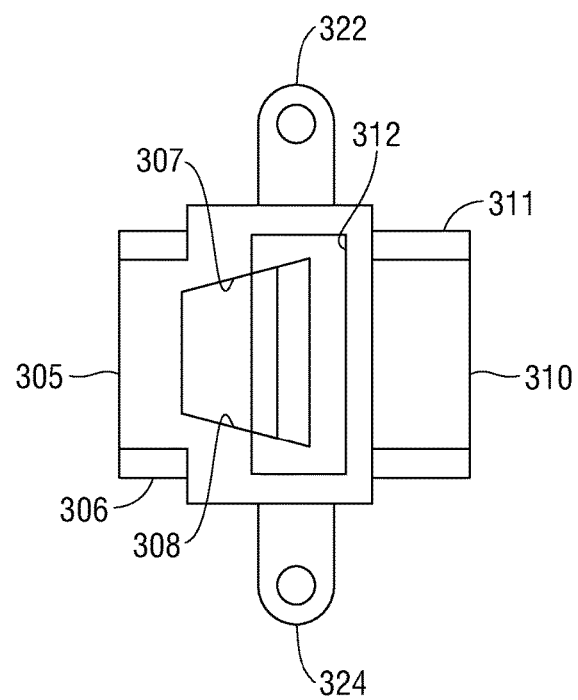
FIG. 3B is a graphic diagram top view of a reconfigurable security slot interface insert according to an embodiment of the present disclosure.

FIG. 3B illustrates a top view of a reconfigurable security slot interface insert according to an embodiment of the present disclosure. The reconfigurable security slot interface insert shows the two-sided, reversible aspect including a first cable lock slot interface 305 and a second cable lock slot interface 310 according to an embodiment herein. In other embodiments, additional sides reconfigurable security slot interface insert may be utilized for plural cable lock system types. The aperture for the first cable lock slot interface 305 is through a first interface collar extension 306. First cable lock slot interface 305 may accommodate an insertable wedge for a first type of cable lock system such as the Noble® wedge cable lock in an example embodiment. The aperture for the second cable lock slot interface 310 is through a second interface collar extension 311 and may accommodate a second type of cable lock system such as the Kensington® Nano-Saver lock system.

The first cable lock slot interface 305 is shown with a trapezoid depicting the location for receiving an insertable wedge system of a Noble® wedge cable lock according to an embodiment. In the example embodiment, the trapezoid shows how an extended, movable wedge portion and a main wedge portion occupy space between and would engage angled retention walls 307 and 308 according to embodiments herein. The angled retention walls 307 and 308 would prevent removal of the inserted wedge system for a first type of cable lock system such as the Noble® wedge lock system in an example embodiment. Angled retention walls 307 and 308 are at the interior end of the aperture of the first cable lock slot interface 305. Similarly, second cable lock slot interface 310 is shown with a rectangle along retention wall 312 which depicts a space internal to the reconfigurable security slot interface insert to accommodate an insertable wedge or a t-bar of a second type of cable lock system according to embodiments herein. Retention wall 312 is at the interior end of the aperture of the second cable lock slot interface 310. As described in embodiments herein, a movable center wedge portion, such as 216 above, may be slidingly extended between two side elbow portions with curved ends, such as 214 and 218. Retention wall 312 interior to the reconfigurable security slot interface insert may retain the insertable wedge, such as that of a Kensington® Nano-Saver type cable lock, in which end hooked geometry of the side elbow portions of the insertable wedge are spread inside the second cable lock slot interface 310. The curved or hooked ends of the insertable and expandable wedge may extend in opposite direction in an embodiment. The curved or hooked ends of the elbow side portions such as 214 and 218 hook around the retaining wall 312 to anchor the insertable wedge into the interior of the reconfigurable security slot interface insert in an example embodiment. In this way the retaining wall 312 may anchor the Kensington® Nano-Saver cable lock insertable wedge in the reconfigurable security slot interface insert and secure an information handling system.

The reconfigurable security slot interface insert also has two coupling tabs 322 and 324 in FIG. 3B which may be used to attach or secure the reconfigurable security slot interface insert in either orientation in an information handling system. In this way either interface 305 or 310 may be implemented such that the information handling system may be able to accommodate a plurality of cable lock types. In some example embodiments, the reconfigurable security slot interface insert has plural cable lock interfaces 305 and 310 providing security slots that may accommodate a Noble® wedge and Kensington® Nano-Saver cable lock types. In other example embodiments, other types of cable lock systems may be used with compatible cable lock slot interface geometry in the reconfigurable security slot interface insert according embodiments herein.

Figure 3C:
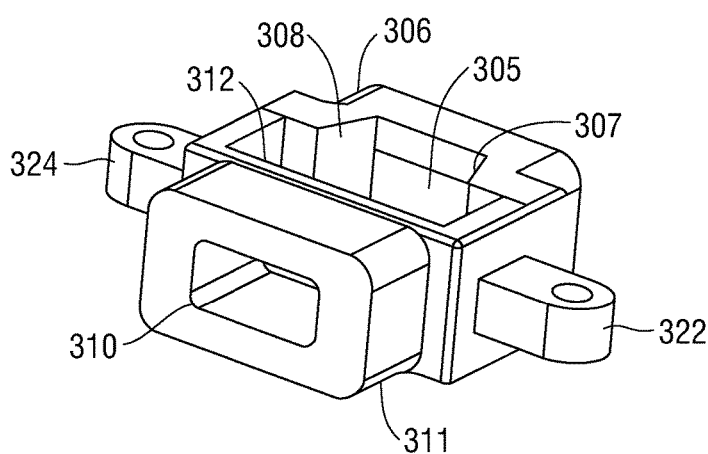
FIG. 3C is another graphic diagram perspective view of a second cable lock slot interface on a reconfigurable security slot interface insert according to an embodiment of the present disclosure.

FIG. 3C illustrates a perspective view of a reconfigurable security slot interface insert according to an embodiment of the present disclosure. FIG. 3C depicts a reverse perspective from the one depicted in FIG. 3A. In FIG. 3C, the perspective on the reconfigurable security slot interface insert has been rotated 180 degrees. It is understood that the reconfigurable security slot interface insert may itself be rotated 180 degrees according to some embodiments when selecting between a first cable slot lock interface 305 and a second cable slot lock interface 310. Thus, FIG. 3C shows the opposite side of the two-sided, reversible reconfigurable security slot interface insert according to an embodiment of the present disclosure. In other embodiments, a plurality of cable slot lock interfaces may be implemented with the reconfigurable security slot interface insert. In one example embodiment, the reconfigurable security slot interface insert has a Kensington® Nano-Saver cable lock type slot interface as the second cable lock slot interface 310 facing the viewer and a Noble® wedge cable lock type slot interface as a first cable lock slot interface 305 that is on the back side of the graphic diagram.

The reconfigurable security slot interface insert shows the second cable lock slot interface 310 able to accommodate a second cable lock insertable wedge system with expandable side elbow portions for attachment and securing a cable lock system of a second type. An aperture of the second cable lock slot interface 310 is provided in a second interface collar extension 311. The second interface collar extension 311 may be configured in some embodiments to be inserted in a mounting aperture in an information handling system chassis when the second cable lock type is desired for use. For example in an embodiment, the second interface collar extension 311 may be of the same perimeter dimension as the first interface collar extension 306 so that it will fit in the same mounting aperture in the information handling system allowing a user to switch between types of cable lock systems deployed for the information handling system. When the reconfigurable security slot interface insert is rotated for use with the second cable lock slot interface 310, the second interface collar extension 311 may be inserted in a mounting aperture of a side of the information handling system chassis such that the second cable lock slot interface 310 faces outward for use with cable lock system of the second type. In the example shown, a Kensington® Nano-Saver cable lock type is used with the first cable lock slot interface 310. A retention wall 312 in the interior of the reconfigurable security slot interface insert is interior to the second cable lock slot interface 310. Retention wall 312 is at the interior end of the aperture of the second cable lock slot interface 310. The retention wall 312 works with the second type of cable lock system insertable wedge with expandable side elbow structures to securely retain the second type of cable lock system wedge extension into the reconfigurable security slot interface insert when the second cable lock slot interface 310 is used as described in embodiments herein. In other embodiments, the second cable lock slot interface 310 may be used with a rotatable t-bar insertable in the horizontal dimension for example and rotated in the vertical dimension to engage retention wall 312.

Hooked ends of the side elbow structures of a Kensington® Nano-Saver cable lock type may be expanded to engaged around retention wall 312 to secure the first cable lock type to an information handling chassis via the reconfigurable security slot interface insert. Hooked or curved sides of a rotatable t-bar structure may anchor a cable lock of this type in the vertical direction in other embodiments within the second cable lock slot interface 310.

In this reversed orientation depicted in FIG. 3C, the first cable lock slot interface 305 is switched around internal to the information handling system and is not used. As seen in the drawing, the first interface collar extension 306 provides the aperture for the first cable lock slot interface 305. Also, interior to the first cable lock slot interface in the reconfigurable security slot interface insert are two angled walls 307 and 308 that would be useful to anchor and secure a first cable lock type such as a Noble® wedge lock system if deployed. However in FIG. 3C, the first cable lock slot interface 305 is rotated internally. The reconfigurable security slot interface insert also includes an attachment mechanism for operatively coupling the reconfigurable security slot interface insert internally to the information handling system chassis. In an example embodiment, plurality of attachment mechanisms, such as coupling tabs 322 and 324 with screw holes, may be used for attachment to the base of an information handling system chassis. In a further example embodiment the attachment mechanism or attachment mechanisms may be used in either orientation such that coupling to the information handling system may occur via the same attachment mechanisms in some embodiments. For example, coupling tabs 322 and 324 may be utilized in a first orientation or in a second orientation rotated 180 degrees from the first orientation to couple the reconfigurable security slot interface insert internally to the information handling system chassis.

Figure 4A:
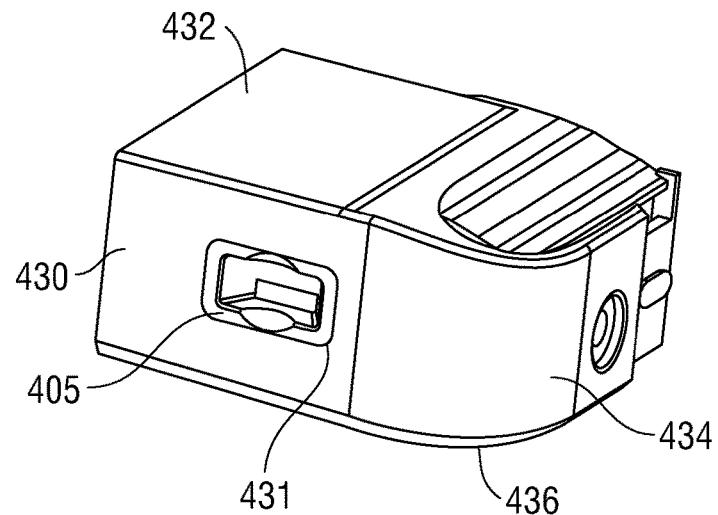
FIG. 4A is a graphic diagram perspective view of a first cable lock slot interface facing externally to an information handling system according to an embodiment of the present disclosure.

FIG. 4A illustrates a perspective view of a portion of the exterior of an information handling system chassis or case according to an embodiment of the present disclosure. The information handling system chassis includes a side surface 430, a top surface 423, a front surface 434, and a bottom surface 436 according to an embodiment. In an example embodiment, a first cable lock slot interface 405 of a reconfigurable security slot interface insert is visible as inserted in a mounting aperture 431 on a side surface 430 of the information handling system according to an embodiment of the present disclosure. A first interface collar extension for the first cable lock slot interface 405 is inserted into the mounting aperture 431 on the side surface 430. In the example embodiment, the first cable lock slot interface 405 may be inserted so that it is flush or slightly recessed with the side surface 430 of the chassis. In other embodiments, the first interface collar extension may protrude at any amount through the mounting aperture 431 in the side surface 430 of the chassis as is desired or necessary. The first cable lock slot interface 405 in the shown example embodiment is a Noble Wedge® slot interface, but it is understood that other cable lock types may be accommodated instead as a first cable lock slot interface 405 in other embodiments. Moreover, the mounting aperture 431 may be implemented on any surface of the information handling chassis including other side surfaces, the front surface 434, a back surface (not shown), or the top 432 or bottom surface 436 in various embodiments. In this way, the first cable lock slot interface 405 may be externally exposed anywhere on the exterior of the information handling system chassis. The reconfigurable security slot interface insert may be securely coupled internally to the information handling system chassis. The secure coupling may be to the bottom surface 436, the side surface 430, the top surface 423 of the chassis in some embodiments. It is understood that in other aspects, the reconfigurable security slot interface insert may be securely coupled via a variety of systems or structures internal to the information handling system chassis to provide a secure anchor aperture for insertable wedge structures of the first type of cable locking system.

Figure 4B:
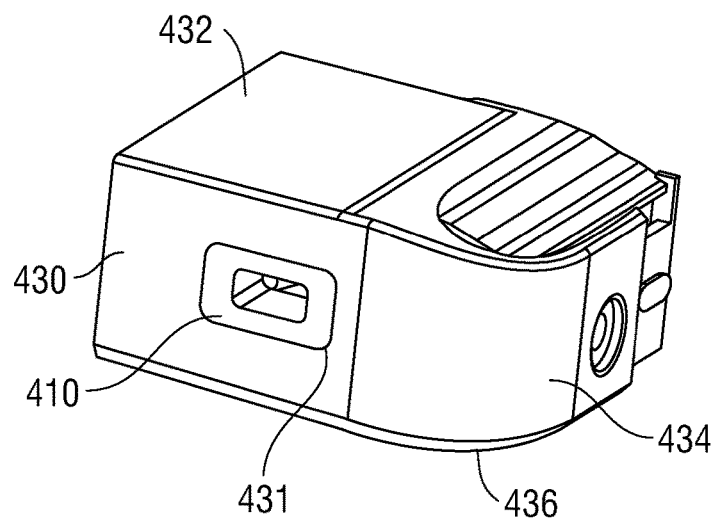
FIG. 4B is a graphic diagram perspective view of a second cable lock slot interface facing externally to an information handling system according to another embodiment of the present disclosure.

FIG. 4B illustrates a perspective view of a portion of the exterior of an information handling system chassis or case according to another embodiment of the present disclosure. The information handling system chassis again includes the side surface 430, the top surface 423, a front surface 434, and a bottom surface 436 according to an embodiment. In the present example embodiment, a second cable lock slot interface 410 of a reconfigurable security slot interface insert is visible as inserted in the mounting aperture 431 on side surface 430 of the information handling system according to an embodiment of the present disclosure. A second interface collar extension for the first cable lock slot interface 410 is inserted into the mounting aperture 431 on the side surface 430. In the example embodiment, the first cable lock slot interface 410 may be inserted so that it is flush or slightly recessed with the side surface 430 of the chassis. In other embodiments, the first interface collar extension may protrude at any amount through the mounting aperture 431 in the side surface 430 of the chassis as is desired or necessary as described above. The first cable lock slot interface 410 in the shown example embodiment is a Kensington® Nano-Saver slot interface, but it is understood that other cable lock types may be accommodated instead as a second cable lock slot interface 410 in other embodiments. Moreover, the mounting aperture 431 may be implemented on any surface of the information handling chassis including other side surfaces, the front surface 434, a back surface (not shown), or the top 432 or bottom surface 436 in various embodiments. The reconfigurable security slot interface insert may be securely coupled internally to the information handling system chassis according to various embodiments herein. The secure coupling may be to the bottom surface 436, the side surface 430, the top surface 423 of the chassis in some embodiments. It is understood that in other aspects, the reconfigurable security slot interface insert may be securely coupled via a variety of systems or structures internal to the information handling system chassis to provide a secure anchor aperture for insertable wedge structures of the second type of cable locking system according to various embodiments.

Figure 5A:
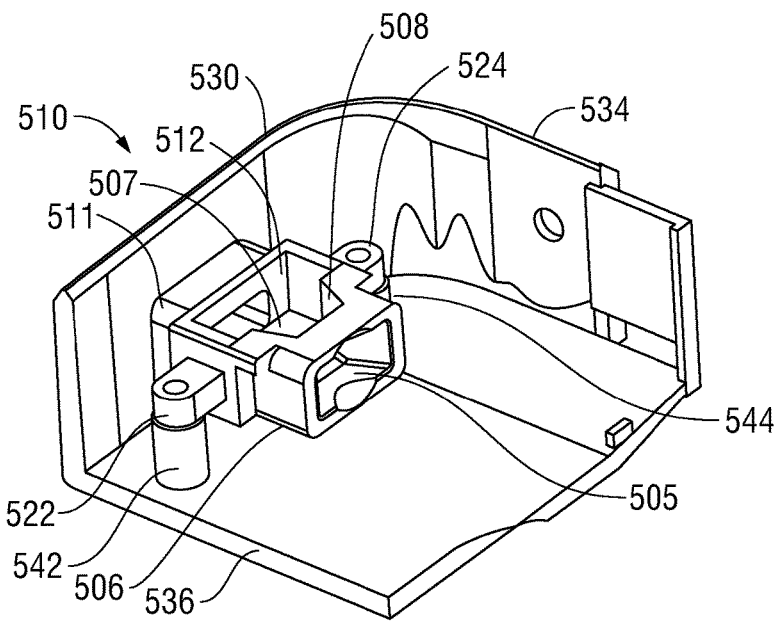
FIG. 5A is a graphic diagram perspective view of a reconfigurable security slot interface insert in a mobile information handling system chassis in a first orientation according to an embodiment of the present disclosure.

FIG. 5A illustrates a perspective view of a cutaway portion of the interior of an information handling system chassis or case according to another embodiment of the present disclosure. The information handling system chassis again includes a side surface 530, a back surface 534, and a bottom surface 536 according to an embodiment. In the present example embodiment, a second cable lock slot interface 510 of a reconfigurable security slot interface insert is mounted in a mounting aperture on side surface 530 of the information handling system according to an embodiment of the present disclosure. The aperture of the second cable lock slot interface 510 is partially obscured in this cutaway perspective view. A second interface collar extension 511 for the second cable lock slot interface 510 is inserted into the mounting aperture on the side surface 530. The second cable lock slot interface 510 in the shown example embodiment is a Kensington® Nano-Saver slot interface, but it is understood that other cable lock types may be accommodated instead as a second cable lock slot interface 510 in other embodiments. Moreover, the mounting aperture may be implemented on any surface of the information handling chassis including other side surfaces, the back surface 534, a front surface (not shown), a top surface (not shown) or bottom surface 536 in various embodiments. In further aspects, retention wall 512 of the reconfigurable security slot interface insert internal to the inner end of the second cable lock slot interface aperture is visible. The retention wall 512 may interface with an insertable wedge system of the second type of cable lock and securely hold hooked ends of sides of the insertable wedge when expanded, or insertable t-bar when rotated, or another mechanism is used to secure the inserted anchor. Thus, the second type of cable lock system may be secured to the information handling system chassis as described in embodiments herein.

The reconfigurable security slot interface insert may be securely coupled internally to the information handling system chassis. The secure coupling may be to the bottom surface 536 as in the shown embodiment. In other embodiments, secure coupling may be made to the side surface 530, the top surface, or other side surfaces or a back or front surface of the chassis in some embodiments. It is understood that in other aspects, the reconfigurable security slot interface insert may be securely coupled via a variety of systems or structures internal to the information handling system chassis to provide a secure anchor aperture for insertable wedge structures or a t-bar system of the second type of cable locking system.

The reconfigurable security slot interface insert of the present embodiment includes an attachment mechanism for securely coupling it to the chassis. In an example embodiment, coupling tabs 522 and 524 with screw holes for attachment to the base of an information handling system chassis may be used. In a particular embodiment, coupling tab 522 may be mounted on post 542 for secure coupling to the bottom surface 536 of the information handling chassis. In another aspect, coupling tab 524 may be mounted on post 544 as a further attachment point for secure coupling of the reconfigurable security slot interface insert. Posts 542 and 544 may be mounted to or formed as part of the bottom surface 536 of the information handling system chassis. A screw may be disposed through the hole in each coupling tab 522 and 524 for fastening to posts 542 and 544 in some example embodiments. Mounting coupling tab 522 to post 524 and coupling tab 524 to post 544 provide for a first orientation of the reconfigurable security slot interface insert. The first orientation shown in FIG. 5A has the second cable lock slot interface 510 exposed externally from the chassis. It is understood that the one or more attachment mechanisms may be reused in some embodiments to securely couple the reconfigurable security slot interface insert in a second or even third orientation. For example, coupling tab 522 mounted to post 544 and coupling tab 524 mounted to post 542 would provide for a second orientation of the reconfigurable security slot interface insert whereby the first cable lock slot interface 505 would be exposed externally of the chassis.

The remainder of the reconfigurable security slot interface insert is also seen in FIG. 5A. The first cable lock slot interface 505 may be seen facing internal to the information handling system chassis at the front or outer edge of a first interface collar extension 506 of the reconfigurable security slot interface insert. It may be appreciated that the first interface collar extension 506 may have an outer perimeter dimension to fit within a mounting aperture on chassis side surface 530 similar to how second interface collar extension 511 fits within the same mounting aperture. In this way, the reconfigurable security slot interface insert may be reconfigured to utilize the first cable lock slot interface 505 instead of the second cable slot lock interface 510 according to various embodiments herein. The reconfigurable security slot interface insert also depicts angled walls 507 and 508 internal to first cable slot lock interface 505. Angled walls 507 and 508 may be internal at the inner edge of the aperture for the first cable slot interface 505. Angled walls 507 and 508 may be used in other embodiments with the first type of cable lock with a different insertable wedge mechanism for anchoring the first type of cable lock to the information handling system chassis via the reconfigurable security slot interface insert. In the shown embodiment, the first cable lock slot interface 505 may be compatible with a first type of cable lock that is a Noble® wedge cable locking system. Other types of cable locking systems may be used on opposing ends of the reconfigurable security slot interface insert according to embodiments herein in yet other aspects.

Figure 5B:
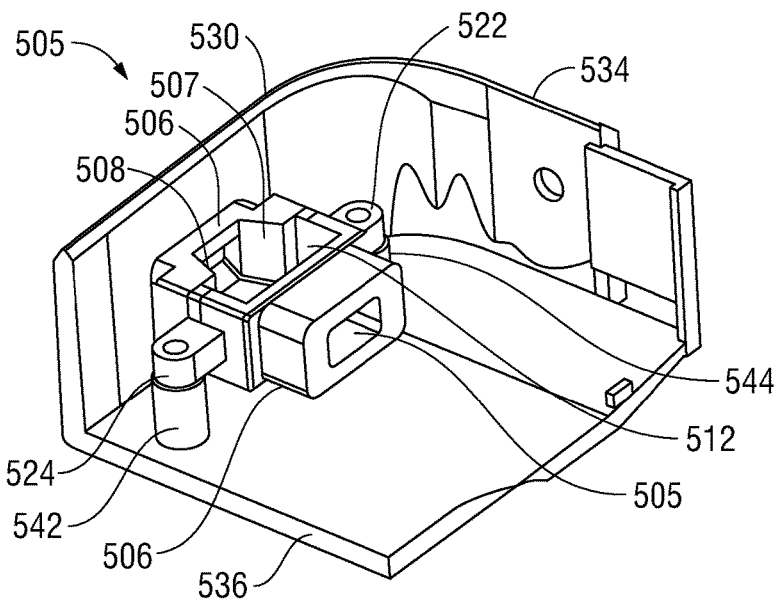
FIG. 5B is a graphic diagram perspective view of a reconfigurable security slot interface insert in a mobile information handling system chassis in a second orientation according to another embodiment of the present disclosure.

FIG. 5B illustrates a perspective view of a cutaway portion of the interior of an information handling system chassis or case according to another embodiment of the present disclosure. It is appreciated that the reconfigurable security slot interface insert may be reoriented to utilize the first cable lock slot interface 505 instead of the second cable lock slot interface 510 in other embodiments of the present disclosure. In the embodiment of FIG. 5B, the reconfigurable security slot interface insert may be rotated 180 degrees such that the first cable lock slot interface 505 faces external to the information handling system chassis. The first cable lock slot interface 505 front aperture is obscured from the perspective viewpoint depicted. First cable lock slot interface is at the front or outer edge edge of the first interface collar extension 506 and is inserted into the mounting aperture on the side surface of the information handling system chassis. Information handling system chassis also shows a back surface 534 and bottom surface 536 in the example embodiment. As described the mounting aperture for the cable lock slot interfaces may be mounted anywhere along any side surface such as 530, back surface 534, front surface (not shown), top surface (not shown) or bottom surface 536 of the information handling system chassis. Internal to the first cable lock slot interface 505 at the inner aperture end are angled walls 507 and 508 which may be utilized to retain an insertable wedge of the first type of cable lock. For example, if the first type of cable lock is a Noble® wedge lock system, a movable wedge portion may slidingly extent next to a primary wedge portion diagonally into the wedge-shaped space created by angled walls 507 and 508. In this way, the Noble® wedge lock insertable wedge may be anchored to the reconfigurable security slot interface insert.

Further, one or more attachment mechanism may be used to securely couple the reconfigurable security slot interface insert internally to the chassis of the information handling system. Several attachment mechanisms are described in embodiments herein including coupling tabs with attachment screws, clips, snap-fit systems, retaining pins, and others. In the example of FIGS. 5A and 5B, coupling tabs 522 and 524 with screw holes are shown. In FIG. 5, the coupling tabs 522 and 524 have been rotated 180 degrees. In the example embodiment, coupling tabs 522 and 524 are reused for secure coupling to the base 536 of the information handling system chassis. In a particular embodiment, coupling tab 522 may now be mounted on post 544 for secure coupling to the bottom surface 536 of the information handling chassis. In another aspect, coupling tab 524 may now be mounted on post 542 as a further attachment point for secure coupling of the reconfigurable security slot interface insert. Posts 544 and 542 may be mounted to or formed as part of the bottom surface 536 of the information handling system chassis as described in various embodiments herein. A screw may be disposed through the hole in each coupling tab 522 and 524 for fastening to posts 544 and 542 respectively in some example embodiments. In this way, the reconfigurable security slot interface insert may be fasten to the chassis to securely couple it there and assist it to anchor a plurality of cable lock system types depending on orientation.

The remainder of reconfigurable security slot interface insert also shown in FIG. 5B includes the second cable lock slot interface 510 facing internally to the information handling system chassis. The second cable lock slot interface 510 is visible in the present embodiment through second interface collar extension 511 of the reconfigurable security slot interface insert. Internal to the second cable lock slot interface 510 is a retaining wall 512 which may be used to anchor a second type of cable lock system wedge insert according to embodiments described herein.

It is understood that the structures and concepts described in the embodiments above for FIGS. 3A-5B may be constructed using a variety of the components. For example, it is appreciated that a variety of fastener systems may be used to fasten the reconfigurable security slot interface insert to the chassis of the information handling system. This may include fastening the reconfigurable security slot interface insert via various screw fasteners as shown, as well as snap-fit ridge structures with receiver structures in some embodiments. Other embodiments may utilize pins, adhesives, welding, clamps, or latches for securely coupling the reconfigurable security slot interface insert of the present embodiments internally to the information handling system chassis. In yet other embodiment, the first and second interface collar extensions 506 and 511 may snap fit or latch to a surface of the information handling system along or adjacent to the mounting aperture. Moreover, it is appreciated that the remainder of the reconfigurable security slot interface insert is wider than the mounting aperture and may not be pulled through the mounting aperture of the information handling system chassis further providing some anchoring of the reconfigurable security slot interface insert. In some embodiments, re-enforced materials such as carbon fiber, aluminum, high-tensile plastics, or other robust materials may be used around the mounting aperture in the chassis. These materials may also be used in some embodiments for the reconfigurable security slot interface insert mounted therein.

It is also understood that in some varied embodiments certain components shown or disclosed may not be utilized at all such as the posts or tabs for secure coupling to the information handling system chassis or various sizes of components may be utilized in varying embodiments. Further, it is also contemplated that variations on the systems described herein may also be combined with portions of any other embodiments in the present disclosure to form a variety of additional embodiments from aspects of those embodiments described herein.

Figure 6:
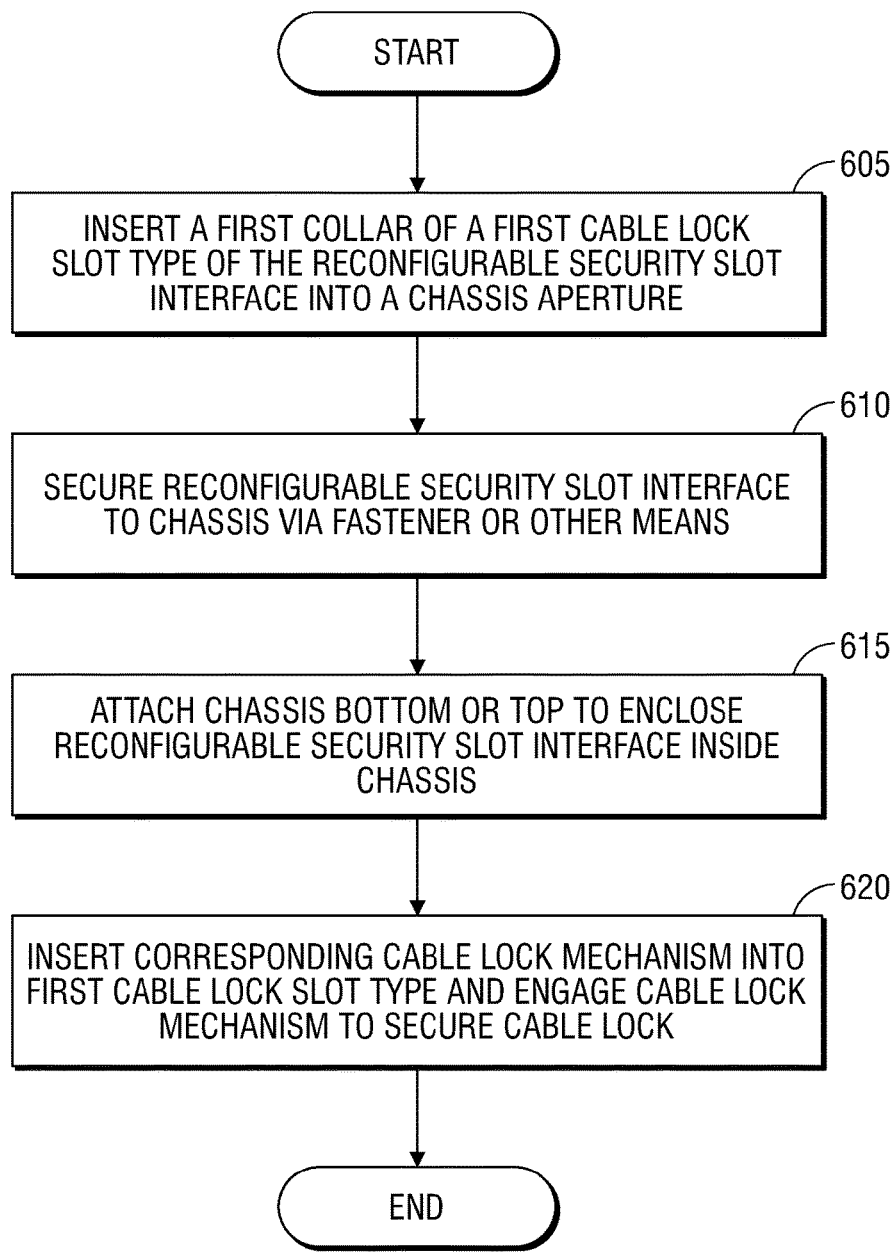
FIG. 6 is a flow diagram of a method of installing a reconfigurable security slot interface insert for use with an information handling system according to an embodiment of the present disclosure.

FIG. 6 illustrates a method of utilization of a reconfigurable security slot interface insert according to various embodiments of the present disclosure. The method of FIG. 6 may be utilized on installation of the reconfigurable security slot interface insert. Installation of the reconfigurable security slot interface insert may be for either of a first or second type of cable locking system. Access internally to the information handling system chassis may be available or provided through removal of a panel forming at least one surface of the information handling system chassis or case. For example, a bottom panel or top panel of the information handling system chassis or case may be accessed by removal of screws or other fasteners to open the information handling system chassis and access the inside. During manufacture of an information handling system, one or more surfaces of the information handling system chassis may not yet be installed such that internal access is still available.

At 605, a user or enterprise IT administrator may select which type of cable locking system may be deployed with an information handling system. Based on that decision, a first interface collar extension for the selected cable lock slot interface may be inserted into a mounting aperture through to the external surface of one of the surfaces of the information handling system chassis.

At 610, the reconfigurable security slot interface insert may be operatively coupled via a variety of fastener systems or other techniques according to various embodiments herein. For example, a screw may be disposed through a coupling tab to a post or other structure coupled to one or more internal chassis sides in some embodiments. In other embodiments, a plurality of screws may be disposed through a plurality of coupling tabs to secure the reconfigurable security slot interface insert to one or more internal chassis sides of the information handling system chassis. For example, the reconfigurable security slot interface insert may be securely coupled to a top, bottom, or side of the chassis in various examples. It can be appreciated that a latch, snap fit receiver, pins, adhesive, welding, clamps or other fastening or attachment systems may be used to operatively couple the reconfigurable security slot interface insert to the information handling system chassis in a secure manner in various embodiments of the present disclosure. It can be further appreciated that either the insert or receiver for any of the snap-fit system, pins, lathes or other attachment mechanisms may be mounted on either the chassis or the reconfigurable security slot interface insert when secure coupling is made according to various embodiments.

Proceeding to 615, the chassis panel top, bottom, or other access may be sealed by attaching the top or bottom to enclose the mounted and attached reconfigurable security slot interface insert. In some embodiments, if the reconfigurable security slot interface insert is operatively coupled to a bottom surface, the access may be made via a top panel. In other embodiments, access may be made via the bottom panel requiring that the reconfigurable security slot interface insert be removed from the mounting aperture, for example on a side surface, at the same time upon removal of the bottom surface of the chassis. Similarly, the reconfigurable security slot interface insert may be operatively and securely coupled to any side surface, front surface, back surface, top surface, or bottom surface in various embodiments. Access internally to the information handling system chassis may be made via a panel on a different surface than the one or more to which the reconfigurable security slot interface insert is operatively coupled according to some embodiments. In other embodiments, the removed panel or surface of the information handling system chassis may have the reconfigurable security slot interface insert operatively coupled to is such that it is easily accessible upon removal of an access panel.

At 620, upon re-attachment of the access panel and enclosure of the reconfigurable security slot interface insert, the cable lock system corresponding to the outer-facing cable lock slot interface may be used to secure the information handling system. An insertable wedge of one or more types, or other insertable anchor mechanism of the selected cable lock system may be inserted in the external-facing aperture of the cable lock slot interface. For example, the insertable wedge may fit into the aperture of the cable lock slot interface in a retracted or unlocked position. Upon insertion of the wedge mechanism, a portion of the wedge mechanism may be extended to engage the wedge mechanism with the reconfigurable security slot interface insert and secure the cable lock to the information handling system chassis. In another embodiment, an insertable wedge with expandable side elbow structures, or a rotatable t-bar may be inserted and expanded or rotated to engage the cable lock slot interface. At this point the method may end, however changing a combination or removing a key may be required to prevent undoing the lock mechanism and, thus, removal of the cable lock. The cable lock system may be used again later to unlock the cable lock system by retracting the wedge system, reducing the expanded width of the side elbow structures of the insertable wedge of a second type, or rotating a t-bar in various example embodiments to an open or unlocked position as described in embodiments herein.

Figure 7:
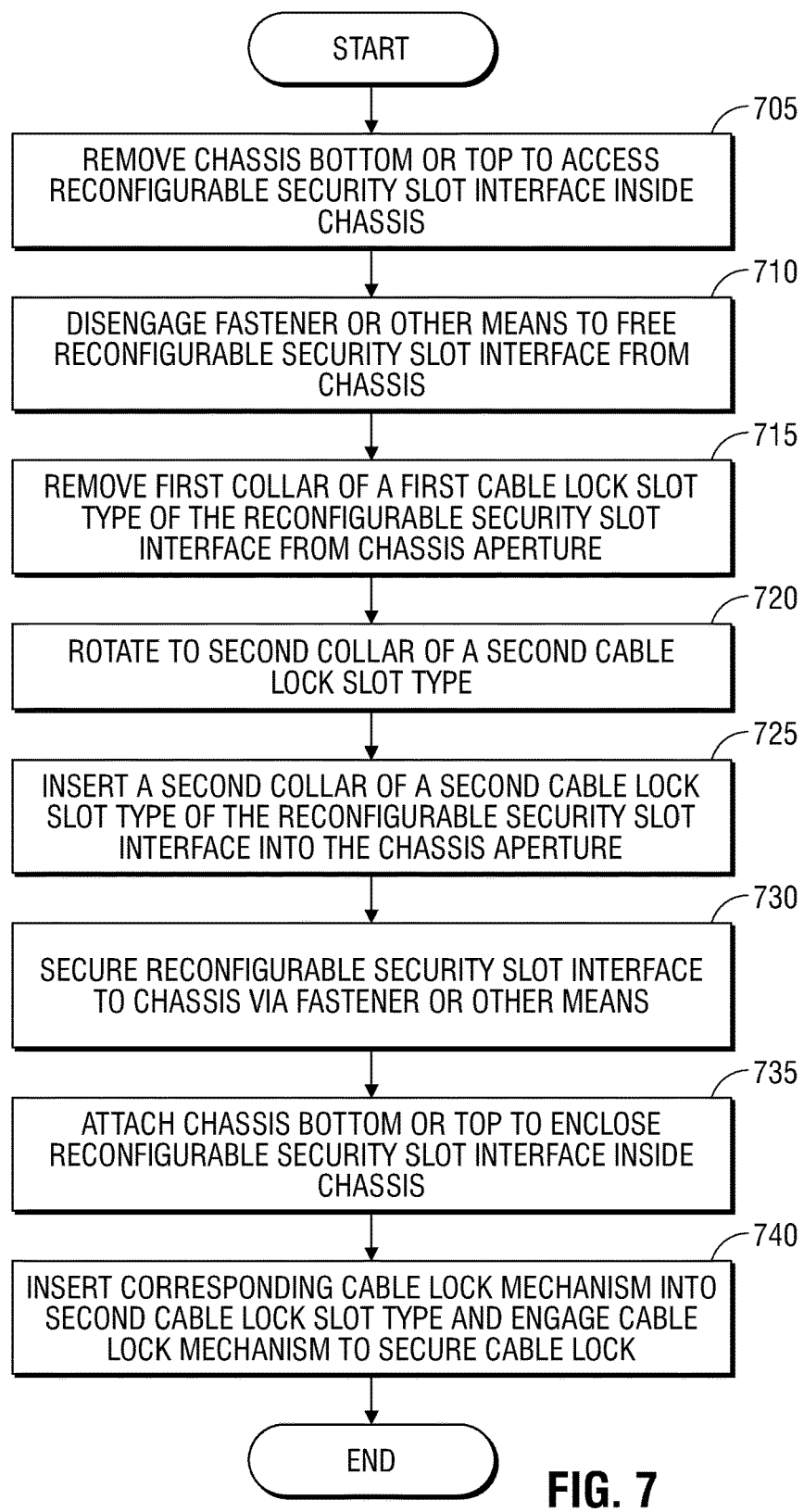
FIG. 7 is a flow diagram of a method of adjusting a reconfigurable security slot interface insert for use with a plurality of cable lock systems according to an embodiment of the present disclosure.

FIG. 7 illustrates a method of utilization of a reconfigurable security slot interface insert according to other embodiments of the present disclosure. The method of FIG. 7 may be utilized by a user or IT administrator to reconfigure the orientation of the reconfigurable security slot interface insert for use with either of a first or second type of cable locking system. A user or enterprise IT administrator may select to switch the type of cable locking system from a first type to a second type to be used with an information handling system.

At 705, access internally to the information handling system chassis may be made available through removal of a panel forming at least one surface of the information handling system chassis or case. For example, a bottom panel or top panel may be accessed by removal of screws or other fasteners to open the information handling system chassis and access the inside.

At 710, the fasteners securely coupling the reconfigurable security slot interface insert to the information system chassis may be removed or opened depending on the attachment mechanism used or intervening structures implemented. Proceeding to 715, the first interface collar extension may be removed from the mounting aperture that extends through to an external surface of the information handling system.

Once the reconfigurable security slot interface insert is free, the reconfigurable security slot interface insert may be rotated so that at least a second interface cable lock slot interface may be utilized at the external mounting aperture. At 720, the reconfigurable security slot interface insert may be rotated 180 degrees in a direction horizontal to the mounting position in some embodiments to implement the second cable lock slot interface. It is understood that in other embodiments, the second interface cable lock slot interface may be mounted in other positions on the reconfigurable security slot interface insert such that rotation around a horizontal axis, a vertical axis or some combination may be utilized to implement a cable lock slot interface that is disposed in a different direction. For example, in some embodiments, the reconfigurable security slot interface insert may have the first cable lock slot interface oriented at a 90 degree angle or some other angle with respect to the second cable lock slot interface to save internal space taken by the reconfigurable security slot interface insert or for other reasons. In such embodiments, a rotation to the newly selected cable lock slot interface for mounting in a mounting aperture of the chassis may be made as understood. In some embodiments, the reconfigurable security slot interface insert may have more than two cable lock slot interface options at differing angles. Reorientation of the newly selected cable lock slot interface of the plurality on the reconfigurable security slot interface insert may be made to face the chassis side having the mounting aperture. The newly selected cable lock slot interface may be mounted in the mounting aperture to expose it to the outside of the information handling system chassis in example embodiments. In one example embodiment, the second cable lock slot interface may be oriented toward the mounting aperture in a side surface of the information handling system chassis.

At 720, the second interface collar extension for the selected second cable lock slot interface may be inserted into a mounting aperture through to the external surface of one of the surfaces of the information handling system chassis. Proceeding to 730, the reconfigurable security slot interface insert may then be operatively re-coupled via the same fastener system or via a different one of the variety of fastener systems or other techniques according to various embodiments herein. For example, a screw may be disposed through a coupling tab to a post or other structure coupled to one or more internal chassis sides in some embodiments. In other embodiments, a plurality of screws may be disposed through a plurality of coupling tabs to secure the reconfigurable security slot interface insert to one or more internal chassis sides of the information handling system chassis. It can be appreciated that a latch, snap fit receiver, pins, adhesive, welding, clamps or other fastening or attachment systems may be used to operatively couple the reconfigurable security slot interface insert to the information handling system chassis in a secure manner in various embodiments of the present disclosure. Any of the aforementioned attachment mechanisms may have either the male or female component where relevant mounted on either the chassis or the reconfigurable security slot interface insert in various embodiments to securely couple the reconfigurable security slot interface insert to the chassis internally.

At 735, the chassis panel top, bottom, or other access may be sealed by attaching the chassis panel via fasteners or other options to enclose the mounted and attached reconfigurable security slot interface insert. For examples attachment screws, latches, a snap-fit mechanism, or other attachment technique known in the art may be used to attach the access panel to the internal area of the information handling system chassis. As described in several embodiments herein, the access panel may be the same chassis side to which the reconfigurable security slot interface insert is operatively coupled or may be different chassis side. In some embodiments, access may be made via a top panel, bottom panel, side panel, back panel, or front panel of the information handling system chassis.

At 740, upon re-attachment of the access panel and enclosure of the reconfigurable security slot interface insert, the second type of cable lock system corresponding to the outer-facing second cable lock slot interface may be used to secure the information handling system. It is understood that either the Noble® wedge lock system, the Kensington® Nano-Saver lock system, or any other cable lock system type may serve as the first, second, or other cable lock type compatible with any of the plurality of cable lock slot interfaces available on the reconfigurable security slot interface insert. For the cable lock system type selected, an insertable wedge, or other anchor mechanism of the selected cable lock system may be inserted in the now externally-facing aperture of the second cable lock slot interface. For example, the insertable wedge may fit into the aperture of the cable lock slot interface in a retracted or unlocked position. Upon insertion of a wedge mechanism, a portion of the wedge mechanism may be extended to engage the wedge mechanism with the internal walls of the reconfigurable security slot interface insert and secure the cable lock to the information handling system chassis in one embodiment. In other embodiments, upon insertion of a insertable wedge mechanism, a center portion of the wedge mechanism may be extended to expand side elbow structures or the t-bar mechanism may be rotated to engage with an internal retaining wall of the reconfigurable security slot interface insert via curved or hooked ends of the insertable wedge or t-bar. In these ways, these or other anchor mechanisms in various embodiments may secure the cable lock to the information handling system chassis. At this point the method may end. Locking and unlocking the cable lock system may be accomplished according to various embodiments described herein or known in the art for various cable locking systems with a variety of anchor mechanisms.

It is appreciated that the methods described in FIG. 6 and FIG. 7 may include additional steps not recited or described or may omit certain steps described. Further, it is contemplated that additional steps or methods may be added or steps may be performed in a different order than depicted or simultaneously in variations on the embodiments described herein. Further, steps described in either method of FIGS. 6 and 7, or other descriptions of the operation with the reconfigurable security slot interface insert of the embodiments described herein, may be implemented in any order as further contemplated from those embodiments.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The device or module can include software, including firmware embedded at a device, such as an Intel® Core™ or ARM® RISC brand processors, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries. Further, devices, structures or other aspects of the mobile information handling systems described or shown as coupled or connected to one another may be connected or coupled in all cases through one or more additional intermediary structures or devices or some structures and devices may not be needed or act as intermediary as shown or described. Several example embodiments are described where such any intermediary structures or no intermediary structures for a coupling or connection of structures may exist.

Although only a few exemplary embodiments have been described in detail herein, those skilled in the art will appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a chassis containing a processor and a memory;
   the chassis having a mounting aperture to receive a first cable lock slot interface;
   a reconfigurable security slot interface insert operatively coupled internally to the chassis; and
   the reconfigurable security slot interface insert having the first cable lock slot interface on a first side of the reconfigurable security slot interface insert and a second cable lock slot interface disposed on a second side of the reconfigurable security slot interface insert, wherein the first cable lock slot interface is oppositely disposed to the second cable lock slot interface on the reconfigurable security slot interface insert, such that the reconfigurable security slot interface insert is adapted to be rotated between having the first or second cable lock slot interface externally exposed via the mounting aperture of the chassis,
   wherein the first cable lock slot interface is compatible with a first cable lock type and the second cable lock slot interface is compatible with a second cable lock type different from the first cable lock type.

2. The system of claim 1, wherein the first cable lock slot interface mounts in the mounting aperture flush to an external side surface of the chassis.

3. The system of claim 1, wherein the first cable lock slot interface includes a first interface collar extension and the second cable lock slot interface includes a second interface collar extension disposed on the reconfigurable security slot interface insert for fittingly mounting in the mounting aperture of the chassis.

4. The system of claim 1, wherein the reconfigurable security slot interface insert includes a coupling tab with a screw hole for operatively coupling the reconfigurable security slot interface insert internally to the chassis via an attachment screw.

5. The system of claim 1, wherein the reconfigurable security slot interface insert has a plurality of angled walls internal to the first cable lock slot interface in the reconfigurable security slot interface insert for receiving an insertable wedge of a first type of cable lock to anchor to the plurality of angled walls.

6. The system of claim 1, wherein the reconfigurable security slot interface insert has a retaining wall internal to the second cable lock slot interface in the reconfigurable security slot interface insert for receiving an insertable wedge with an extendable center wedge and expandable side elbow portions of the second type of cable lock with curved ends to anchor to the retaining wall.

7. The system of claim 1, wherein the first cable lock slot interface is oppositely disposed to the second cable lock slot interface on the reconfigurable security slot interface insert such that the reconfigurable security slot interface insert is adapted to be rotated 180 degrees between having the first or second cable lock slot interface externally exposed via the mounting aperture of the chassis.

8. A reconfigurable security slot interface insert comprising:
   first cable lock slot interface aperture through a first interface collar extension;
   a second cable lock slot interface aperture through a second interface collar extension;
   the first interface collar extension and the second interface collar extension disposed on the reconfigurable security slot interface insert for fittingly mounting in a mounting aperture of an information handling system chassis;
   a plurality of angled walls disposed internal to the first cable lock slot interface aperture and adjacent to the internal end of the first cable lock slot interface aperture that is compatible to anchor a first type of cable lock system; and
   a retaining wall disposed internal to the second cable lock slot interface aperture that is compatible to anchor a second type of cable lock system different from the first type of cable lock system,
   wherein the reconfigurable security slot interface insert is adapted to be rotated to a first orientation to implement the first cable lock slot interface aperture and rotated to a second orientation to implement the second cable lock slot interface aperture in the mounting aperture of the information handling system chassis.

9. The reconfigurable security slot interface insert of claim 8, wherein the first interface collar extension is oppositely disposed to the second interface collar extension on the reconfigurable security slot interface insert such that the reconfigurable security slot interface insert is adapted to be rotated 180 degrees to reconfigure utilization between the first or second cable lock slot interface apertures in the mounting aperture.

10. The reconfigurable security slot interface insert of claim 8, wherein the retaining wall in the security slot interface insert is orthogonal to the second cable lock slot interface aperture such that the second type of cable lock is compatible to engage the retaining wall via an insertable wedge with an extendable center wedge and expandable side elbow portions or a rotatable t-bar.

11. The reconfigurable security slot interface insert of claim 8, wherein the reconfigurable security slot interface insert operatively couples internally to the information handling system chassis via a snap-fit attachment coupling.

12. The reconfigurable security slot interface insert of claim 8, wherein the reconfigurable security slot interface insert includes a coupling tab with a screw hole for operative coupling the reconfigurable security slot interface insert internally with the information handling system chassis.

13. The reconfigurable security slot interface insert of claim 8, wherein the first cable lock slot interface aperture may receive an insertable wedge and upon extension of a movable wedge portion to expand the width of the insertable wedge to anchor the insertable wedge against the plurality of angled walls.

14. The reconfigurable security slot interface insert of claim 8, wherein the first interface collar extension and the second interface collar extension have a similar perimeter dimension and the first cable lock slot interface aperture and the second cable lock slot interface aperture have different aperture dimensions.

15. An information handling system comprising:
a chassis containing a processor and a memory;
the chassis having a mounting aperture to receive a first interface collar extension or a second interface collar extension of a reconfigurable security slot interface insert;
the reconfigurable security slot interface insert operatively coupled internally to the chassis, the reconfigurable security slot interface insert including both a first cable lock slot interface aperture through the first interface collar extension and a second cable lock slot interface through the second interface collar extension;
an angled wall interior to the first cable lock slot interface aperture in the reconfigurable security slot interface insert that is compatible with a first cable lock type having an insertable wedge; and
a retaining wall interior to the second cable lock slot interface aperture in the reconfigurable security slot interface insert that is compatible with a second cable lock type having an insertable wedge with expandable elbow side portions, wherein the second cable lock type is different from the first cable lock type.

16. The system of claim 15, wherein the first interface collar extension or the second interface collar extension in the mounting aperture is recessed relative to an external side surface of the chassis.

17. The system of claim 15, wherein the reconfigurable security slot interface insert includes a coupling tab with a screw hole for operatively coupling the reconfigurable security slot interface insert to the chassis via an attachment screw.

18. The system of claim 15, wherein mounting aperture on the chassis is reinforced to strengthen the anchoring by the reconfigurable security slot interface insert.

19. The system of claim 15, wherein the first cable lock slot interface aperture is disposed on a different side of the reconfigurable security slot interface insert to the second cable lock slot interface aperture such that the reconfigurable security slot interface insert is adapted to be rotated between the first cable lock slot interface aperture and the second cable lock slot interface aperture to be externally presented via the mounting aperture in the chassis.

20. The system of claim 19, wherein a coupling tab for operatively coupling the reconfigurable security slot interface insert to the chassis via an attachment screw is adapted to be utilized when the reconfigurable security slot interface insert is rotated to present each of the first cable lock slot interface aperture or the second cable lock slot interface aperture via the mounting aperture in the chassis.

\* \* \* \* \*